US006436773B1

United States Patent
Yu

(10) Patent No.: US 6,436,773 B1
(45) Date of Patent: Aug. 20, 2002

(54) FABRICATION OF TEST FIELD EFFECT TRANSISTOR STRUCTURE

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/846,842

(22) Filed: May 1, 2001

(51) Int. Cl.[7] .............................................. H01L 21/336
(52) U.S. Cl. ........................ 438/284; 438/301; 438/303
(58) Field of Search .................................. 438/301, 303, 438/424, 300, 592, 197, 284

(56) References Cited

U.S. PATENT DOCUMENTS

| | | | | |
|---|---|---|---|---|
| 3,696,273 A | * | 10/1972 | Foster ..................... | 317/235 R |
| 5,753,942 A | * | 5/1998 | Seok ......................... | 257/133 |
| 5,847,413 A | * | 12/1998 | Yamazaki et al. ............ | 257/69 |
| 5,923,984 A | * | 7/1999 | Qian ......................... | 438/284 |
| 5,956,608 A | * | 9/1999 | Khurana et al. ............ | 438/627 |
| 6,153,978 A | * | 11/2000 | Okamoto ................. | 315/169.3 |
| 6,214,681 B1 | * | 4/2001 | Yu ............................. | 438/300 |
| 6,242,321 B1 | * | 6/2001 | Acosta et al. ............... | 438/424 |

* cited by examiner

Primary Examiner—John F. Niebling
Assistant Examiner—Walter L. Lindsay, Jr.
(74) Attorney, Agent, or Firm—Monica H. Choi

(57) ABSTRACT

For fabricating a test field effect transistor on a semiconductor substrate, a layer of gate dielectric material is deposited on the semiconductor substrate, and a layer of gate electrode material is deposited on the layer of gate dielectric material. A dummy structure is formed on the gate electrode material, and the dummy structure is disposed over a shaped area of the gate electrode material and of the semiconductor substrate. The dummy structure has at least one sidewall around a perimeter of the shaped area. A spacer structure is formed to surround the at least one sidewall of the dummy structure outside of the perimeter of the shaped area. The dummy structure is etched away such that the shaped area of the gate electrode material is exposed and such that the spacer structure remains outside of the perimeter of the shaped area. Any exposed regions of the gate electrode material and of the gate dielectric material not under the spacer structure are etched away. The gate dielectric material remaining under the spacer structure forms a gate dielectric of the test field effect transistor, and the gate electrode material remaining under the spacer structure forms a gate electrode of the test field effect transistor. A drain and source dopant is implanted into exposed regions of the semiconductor substrate to form a first drain or source junction within the shaped area surrounded by the gate dielectric and the gate electrode, and to form a second drain or source junction outside the shaped area beyond the gate dielectric and the gate electrode. A width of the test field effect transistor is the perimeter of the shaped area, and a length of the test field effect transistor is the width of the gate dielectric and the gate electrode extending out from the perimeter of the shaped area.

9 Claims, 4 Drawing Sheets

FABRICATION OF TEST FIELD EFFECT TRANSISTOR STRUCTURE

TECHNICAL FIELD

The present invention relates generally to fabrication of field effect transistors, and more particularly, to fabrication of a test field effect transistor having a large width formed from a perimeter of a shaped area, using a minimized number of processing steps for minimized contamination.

BACKGROUND OF THE INVENTION

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension junction 104 and a source extension junction 106 formed within an active device area 126 of the semiconductor substrate 102. The drain extension junction 104 and the source extension junction 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 farther includes a gate dielectric 116 and a gate electrode 118 which may be comprised of polysilicon. A gate silicide 120 is formed on the polysilicon gate electrode 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where a MOSFET is fabricated therein.

The MOSFET 100 also includes a spacer 122 disposed on the sidewalls of the gate electrode 118 and the gate dielectric 116. When the spacer 122 is comprised of silicon nitride ($Si_3N_4$), then a spacer liner oxide 124 is deposited as a buffer layer between the spacer 122 and the sidewalls of the gate electrode 118 and the gate dielectric 116.

A new material may be developed for forming a structure of the MOSFET such as a new material for the gate dielectric 116 or for the gate electrode 118. The operation of a MOSFET with such new material is tested before using such new material in integrated circuit products. A mechanism is desired for fabricating a test MOSFET with such new material to test the operation of a MOSFET with the new material. The test MOSFET is desired to be fabricated with a relatively minimized number of fabrication steps to reduce contamination and is desired to have a relatively large width such that current crowding effects and parasitic resistance are not significant factors during testing of the operation of the MOSFET. Current crowding effects and parasitic resistance of a MOSFET, which are known to one of ordinary skill in the art of integrate circuit fabrication, degrade the proper operation of the MOSFET to obscure testing of the operation of the field effect transistor with a new material for a structure of the field effect transistor.

SUMMARY OF THE INVENTION

Accordingly, in a general aspect of the present invention, a test field effect transistor is fabricated with a large width formed from a perimeter of a shaped area, using a minimized number of processing steps for minimized contamination.

In one embodiment of the present invention, in a method for fabricating a test field effect transistor on a semiconductor substrate, a layer of gate dielectric material is deposited on the semiconductor substrate, and a layer of gate electrode material is deposited on the layer of gate dielectric material. A dummy structure is formed on the gate electrode material, and the dummy structure is disposed over a shaped area of the gate electrode material and of the semiconductor substrate. The dummy structure has at least one sidewall around a perimeter of the shaped area. A spacer structure is formed to surround the at least one sidewall of the dummy structure outside of the perimeter of the shaped area, and the spacer structure has a width extending out from the perimeter of the shaped area. The dummy structure is etched away such that the shaped area of the gate electrode material is exposed and such that the spacer structure remains outside of the perimeter of the shaped area.

Any exposed regions of the gate electrode material and of the gate dielectric material not under the spacer structure are etched away. The gate dielectric material remaining under the spacer structure forms a gate dielectric of the test field effect transistor, and the gate electrode material remaining under the spacer structure forms a gate electrode of the test field effect transistor. The gate dielectric and the gate electrode are formed outside of the perimeter of the shaped area on the semiconductor substrate. A drain and source dopant is implanted into exposed regions of the semiconductor substrate to form a first drain or source junction from the drain and source dopant being implanted into the semiconductor substrate within the shaped area surrounded by the gate dielectric and the gate electrode, and to form a second drain or source junction from the drain and source dopant being implanted into the semiconductor substrate outside the shaped area beyond the gate dielectric and the gate electrode. A width of the test field effect transistor is the perimeter of the shaped area, and a length of the test field effect transistor is the width of the gate dielectric and the gate electrode extending out from the perimeter of the shaped area.

The present invention may be used to particular advantage when the shaped area is a circular shape having a diameter of about 0.5 micrometers, and when the dummy structure is comprised of silicon nitride ($Si_3N_4$) with the spacer structure being comprised of silicon dioxide ($SiO_2$).

In this manner, the test field effect transistor structure is fabricated with a relatively few processing steps. A processing step increases the probability for contamination of the test field effect transistor. Thus, fewer processing steps minimize contamination of the test field effect transistor. Minimized contamination is desired because failure of the test field effect transistor from contamination obscures testing of the operation of the field effect transistor with a new material for a structure of the field effect transistor. In addition, the width of the field effect transistor around the perimeter of the shaped area is relatively large to minimize current crowding effects and to minimize parasitic resistance of the field effect transistor. Current crowding effects and parasitic resistance of a field effect transistor degrade the proper operation of the field effect transistor to obscure testing of the operation of the field effect transistor with a new material for a structure of the field effect transistor.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, and 12 refer to elements having similar structure and function.

DETAILED DESCRIPTION

Figure 1:
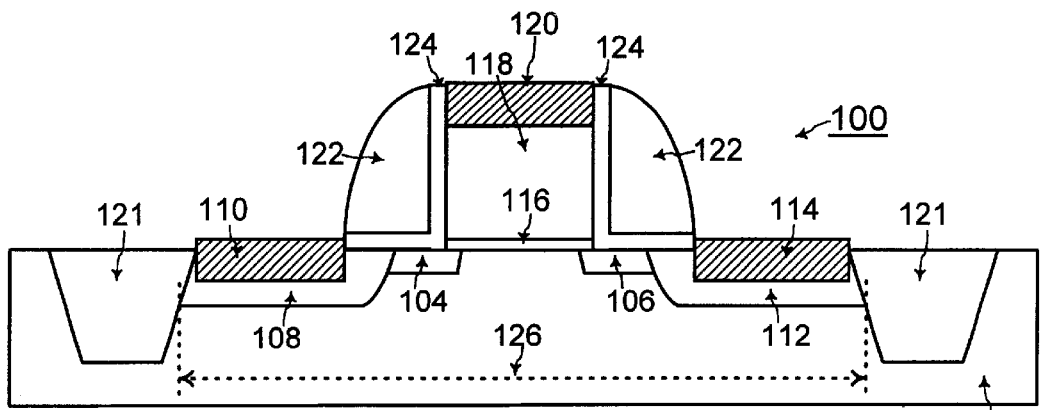
FIG. 1 shows a cross-sectional view of a conventional MOSFET (Metal Oxide Semiconductor Field Effect Transistor) forming integrated circuit products.
Figure 2:
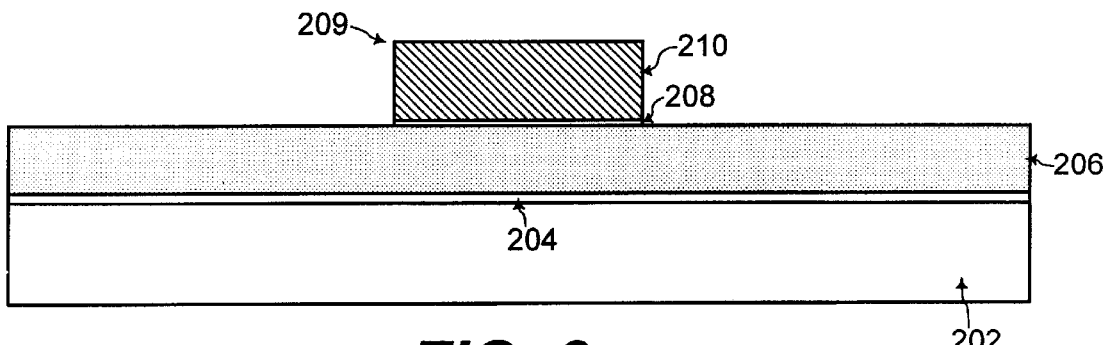
FIGS. 2, 3, 4, 5, 6, 7, 8, 9, 10, 11, and 12 show top and cross-sectional views for illustrating the steps for fabricating a test field effect transistor with a large width formed from a perimeter of a shaped area, using a minimized number of processing steps for reducing the chances of contamination, according to an embodiment of the present invention.

In the cross-sectional view of FIG. 2, for fabricating a test MOSFET (Metal Oxide Semiconductor Field Effect Transistor), a layer of gate dielectric material 204 is deposited on a semiconductor substrate 202. In one embodiment of the present invention, the semiconductor substrate is comprised of silicon. The layer of gate dielectric material 204 may be comprised of a new material for testing the operation of the test MOSFET with such a new material for the gate dielectric. Alternatively, the layer of gate dielectric material 204 may be comprised of a known material used for forming a gate dielectric of a MOSFET. In that case, the layer of gate dielectric material 204 is comprised of a dielectric material having a dielectric constant that is higher than that of silicon dioxide ($SiO_2$), according to one embodiment of the present invention. When the gate dielectric of a MOSFET has a dielectric constant that is higher than the dielectric constant of silicon dioxide ($SiO_2$), the gate dielectric has a higher thickness than if the gate dielectric were comprised of silicon dioxide ($SiO_2$), to minimize undesired tunneling current through the gate dielectric. Processes for depositing such a layer of gate dielectric material 204 are known to one of ordinary skill in the art of integrate circuit fabrication.

Further referring to FIG. 2, a layer of gate electrode material 206 is deposited on the layer of gate dielectric material 204. The layer of gate electrode material 206 may be comprised of a new material for testing the operation of the test MOSFET with such a new material for the gate electrode. Alternatively, the layer of gate electrode material 206 may be comprised of a known material used for forming a gate electrode of a MOSFET. For example, the layer of gate electrode material 206 is comprised of silicon, silicon germanium, or a metal, according to one embodiment of the present invention. Processes for depositing such a layer of gate electrode material 206 are known to one of ordinary skill in the art of integrate circuit fabrication.

In addition, referring to FIG. 2, a dummy structure 209 is formed on the layer of gate electrode material 206. In one embodiment of the present invention, the dummy structure 209 includes a buffer oxide structure 208 comprised of silicon dioxide ($SiO_2$) and having a thickness in a range of from about 100 angstroms to about 200 angstroms. Furthermore, the dummy structure 209 is comprised of a nitride structure 208 comprised of silicon nitride ($Si_3N_4$) and having a thickness in a range of from about 1000 angstroms to about 2000 angstroms according to one embodiment of the present invention. Processes for depositing and patterning silicon dioxide ($SiO_2$) and silicon nitride ($Si_3N_4$) to form the dummy structure 209 are known to one of ordinary skill in the art of integrate circuit fabrication.

Figure 3:
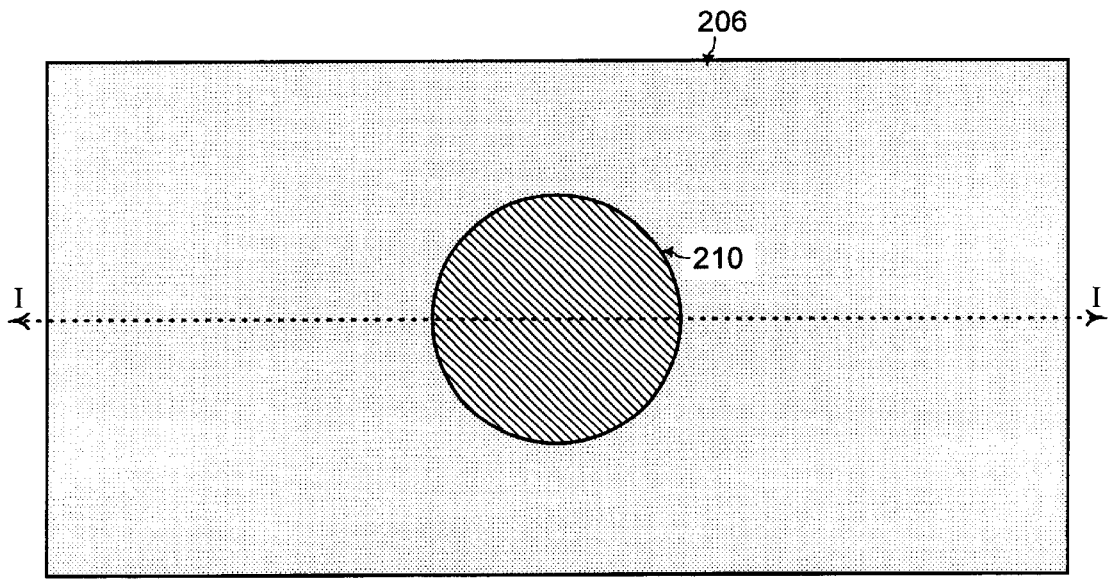

Referring to FIGS. 2 and 3, FIG. 3 illustrates a top view of the dummy structure 209. The cross-sectional view of FIG. 2 is across dashed line A—A of FIG. 3. Referring to FIG. 3, the dummy structure 209 has a circular shape such that the dummy structure 209 is a circular island formed on the layer of gate electrode material 206. The circular shape of the dummy structure 209 is relatively large having a diameter of about 0.5 micrometers according to one example embodiment of the present invention. The circular dummy structure 209 is disposed over a circular shaped area of the gate electrode material 206 and of the semiconductor substrate 202. The dummy structure 209 has sidewalls around the perimeter of the circular shaped area.

Figure 4:
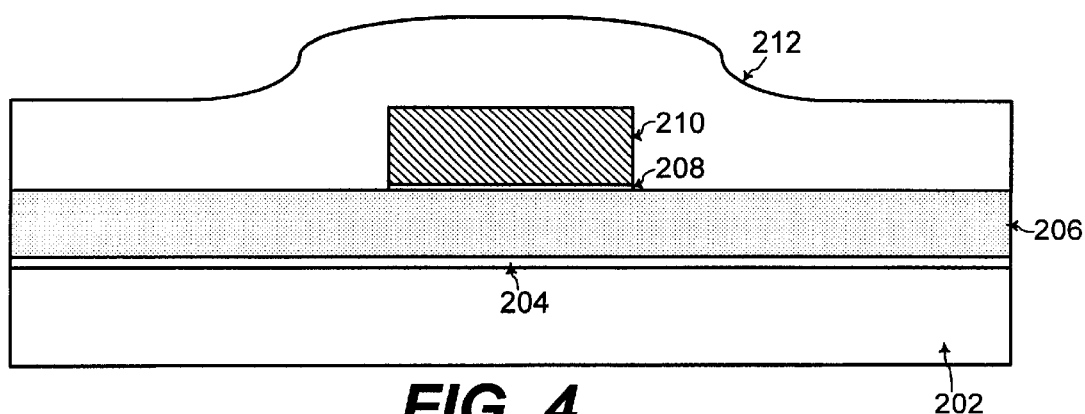

Referring to FIG. 4, a layer of insulating material 212 is conformally deposited to surround the dummy structure 209. The layer of insulating material 212 is comprised of silicon dioxide ($SiO_2$) having a thickness in a range of from about 4000 angstroms to about 5000 angstroms according to one embodiment of the present invention. Processes for conformally depositing such a layer of insulating material 212 are known to one of ordinary skill in the art of integrate circuit fabrication.

Figure 5:
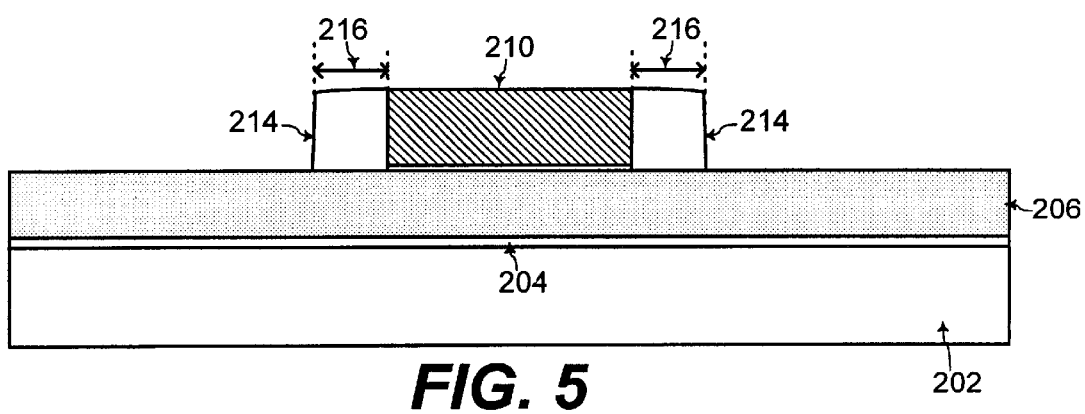
Figure 6:
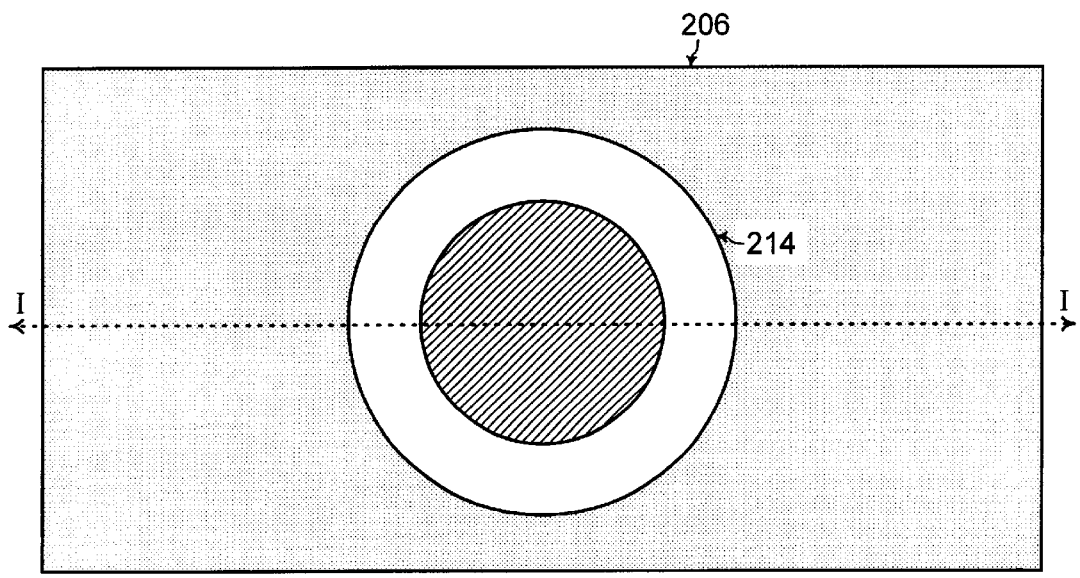

Referring to FIG. 5, the layer of insulating material 212 is anisotropically etched to form a spacer structure 214 on the sidewall of the dummy structure 209. The spacer structure 214 is comprised of the insulating material 212 remaining on the sidewall of the dummy structure 209. The spacer structure 214 has a width 216 in a range of from about 20 nanometers to about 200 nanometers extending out from the sidewall of the dummy structure 209 according to one embodiment of the present invention. FIG. 6 illustrates a top view of the spacer structure 214 formed on the sidewall of the dummy structure 209. The cross-sectional view of FIG. 5 is across dashed line A—A of FIG. 6. Processes, such as anisotropic etching processes, for forming the spacer structure 214 from layer of insulating material 212 are known to one of ordinary skill in the art of integrate circuit fabrication.

Figure 7:
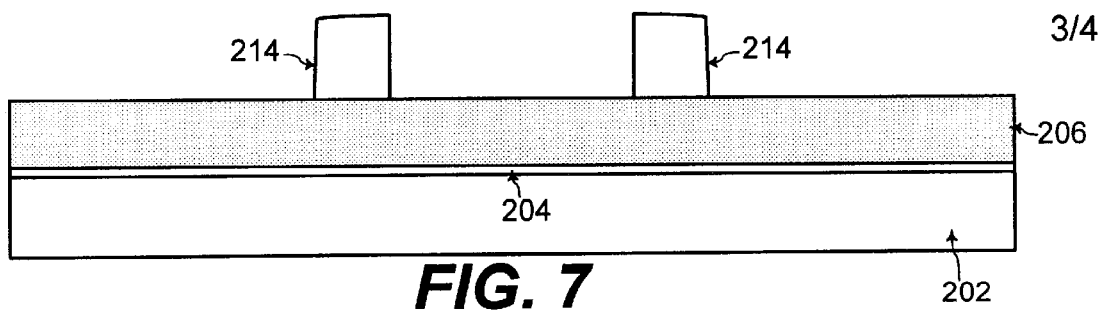

Referring to FIG. 7, after formation of the spacer structure 214, the dumnmy structure 209 including the buffer oxide structure 208 and the nitride structure 210 is etched away to expose the shaped area of the gate electrode material 206 that was disposed below the dummy structure 209. The spacer structure 214 remains to surround the perimeter of the shaped area that was occupied by the dummy structure 209. Processes for etching away the dummy structure 209 which is comprised of silicon nitride ($Si_3N_4$) and the thin buffer silicon dioxide ($SiO_2$) for example are known to one of ordinary skill in the art of integrated circuit fabrication.

Figure 8:
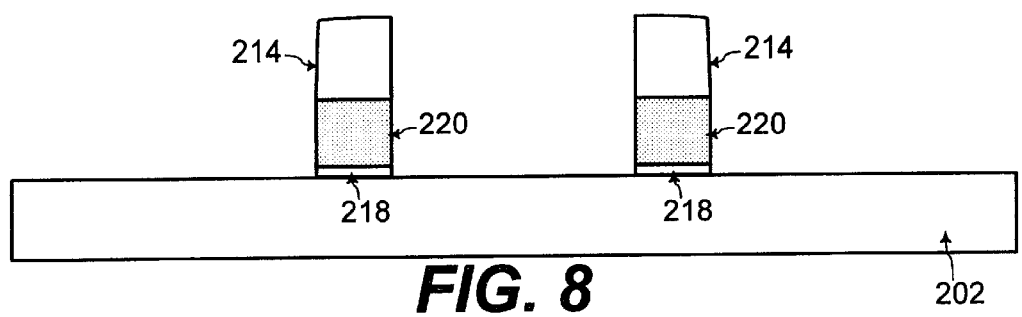
Figure 9:
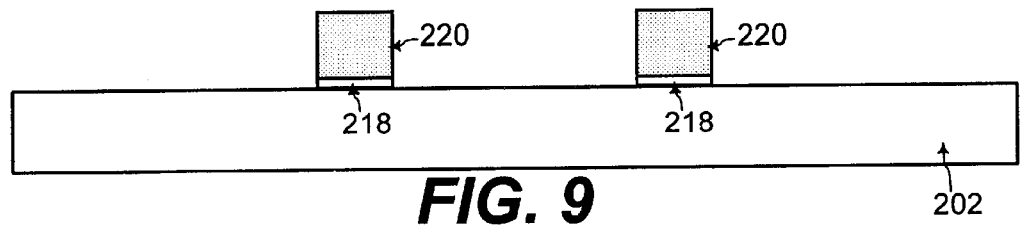

Referring to FIG. 8, the spacer structure 214 is used as a hardmask to etch away any exposed regions of the layer of gate dielectric material 204 and the layer of gate electrode material 206 not under the spacer structure 214. The gate dielectric material 204 remaining under the spacer structure 214 forms a gate dielectric 218 of the test MOSFET, and the gate electrode material 206 remaining under the spacer structure 214 forms a gate electrode 220 of the MOSFET. Referring to FIG. 9, after etching the layer of gate dielectric material 204 and the layer of gate electrode material 206 to form the gate dielectric 218 and the gate electrode 220, the spacer structure 214 is etched away. Processes for etching away the spacer structure 214 comprised of silicon dioxide (SiO$_2$) for example are known to one of ordinary skill in the art of integrated circuit fabrication.

Figure 10:
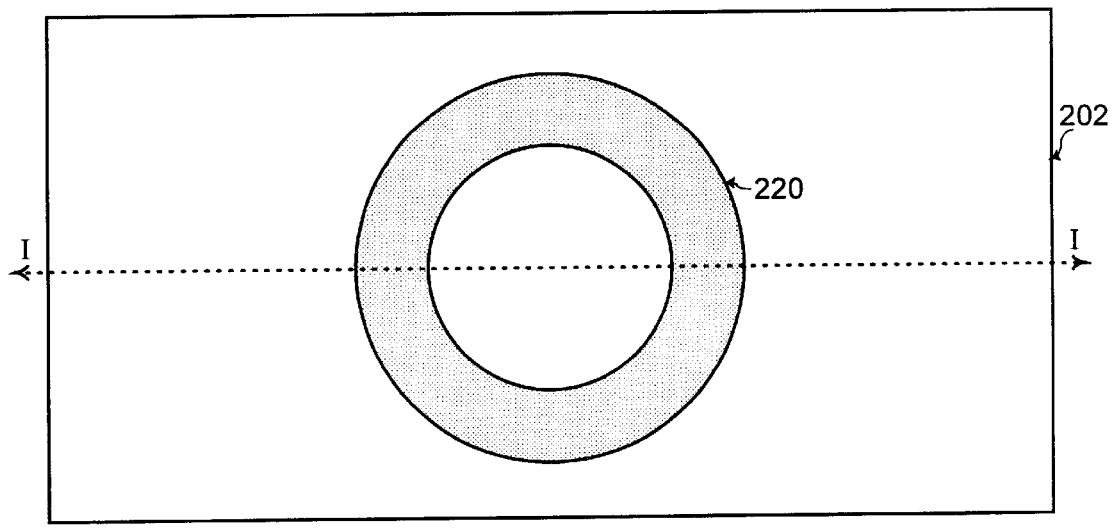

FIG. 10 shows a top view of the gate electrode 220 formed around the perimeter of the circular shaped area that was occupied by the dummy structure 209. The cross-sectional view of FIG. 9 is across dashed line A—A of FIG. 10. The region of the semiconductor substrate 202 within the circular shaped area that was occupied by the dummy structure 209 is exposed and is surrounded by the gate dielectric 218 and the gate electrode 220. In addition, the region of the semiconductor substrate 202 outside of the gate dielectric 218 and the gate electrode 220 is exposed.

Figure 11:
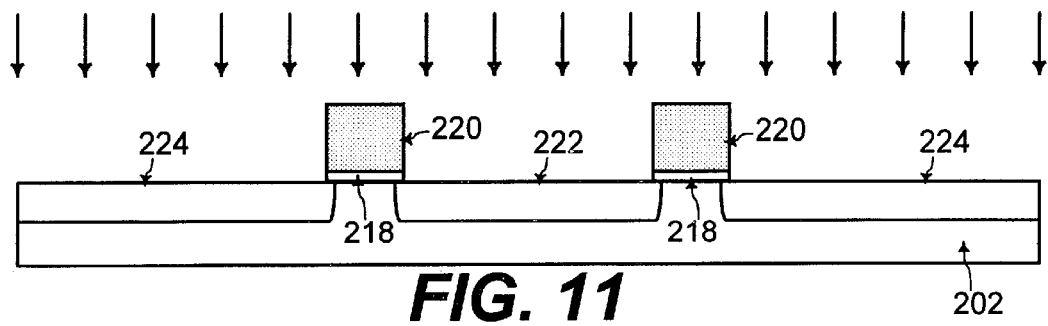

Referring to FIGS. 10 and 11, a drain and source dopant is implanted into the exposed regions of the semiconductor substrate 202. The drain and source dopant implanted into the region of the semiconductor substrate 202 within the circular shaped area that was occupied by the dummy structure 209 forms a first drain or source junction 222 of the test MOSFET. The drain and source dopant implanted into the region of the semiconductor substrate 202 outside of the gate dielectric 218 and the gate electrode 220 forms a second drain or source junction 224 of the test MOSFET. The drain and source dopant is also implanted into the gate electrode 220 when the gate electrode 220 is comprised of a semiconductor material such as polysilicon or silicon germanium for example.

The channel region of the test MOSFET is the region of the semiconductor substrate 202 disposed below the gate dielectric 218 and between the first drain or source junction 222 and the second drain or source junction 224. The width of the test MOSFET is the perimeter of the circular shaped area that was occupied by the dummy structure 209. When the dummy structure 209 has a diameter of about 0.5 micrometers according to one embodiment of the present invention, the test MOSFET has a relatively large width. The length of the test MOSFET is the width of the gate dielectric 218 and the gate electrode 220 extending out from the perimeter of the circular shaped area that was occupied by the dummy structure 209 (i.e., the width 216 of the spacer structure 214 in FIG. 5).

The drain and source dopant is an N-type dopant such as phosphorous or arsenic for example for fabrication of a test NMOSFET (N-channel Metal Oxide Semiconductor Field Effect Transistor). Alternatively, the drain and source dopant is a P-type dopant such as boron for example for fabrication of a test PMOSFET (P-channel Metal Oxide Semiconductor Field Effect Transistor). Processes for implantation of such a drain and source dopant are known to one of ordinary skill in the art of integrated circuit fabrication.

A thermal anneal process is performed to activate the drain and source dopant within the first and second drain or source junctions 222 and 224 and within the gate electrode 220 when the gate electrode 220 is comprised of a semiconductor material. Thermal anneal processes for activating dopant are known to one of ordinary skill in the art of integrated circuit fabrication.

Figure 12:
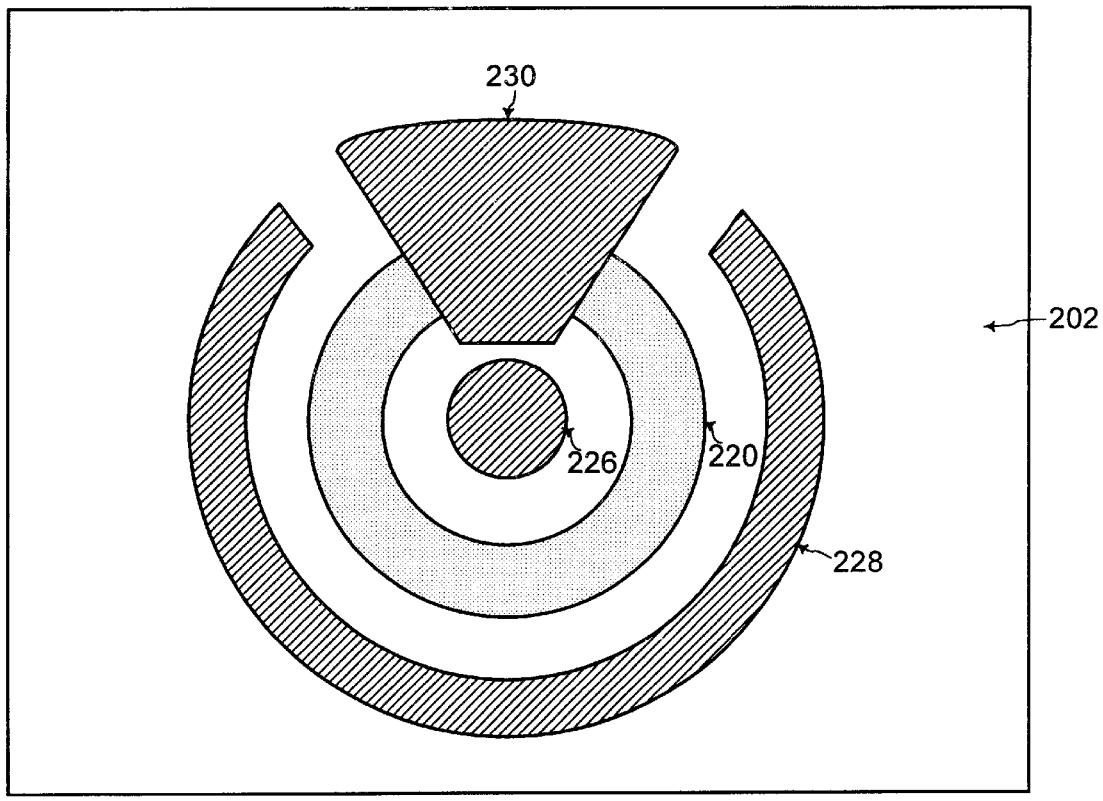

Referring to FIGS. 11 and 12, a first drain or source contact 226 comprised of a metal according to one embodiment of the present invention is formed on the first drain or source junction 222 for providing connection to a drain or source of the test MOSFET. A second drain or source contact 228 comprised of a metal according to one embodiment of the present invention is formed on a portion of the second drain or source junction 224 for providing connection to the other drain or source of the test MOSFET. A gate contact 230 comprised of a metal according to one embodiment of the present invention is formed on a portion of the gate electrode 220 for providing connection to the gate of the test MOSFET. Metal is used for the first and second drain or source contacts 226 and 228 and for the gate contact 230 such that a silicidation process is not used to minimize the number of processing steps according to one embodiment of the present invention.

In this manner, the test MOSFET structure is fabricated with a relatively few processing steps. Each processing step increases the probability for contamination of the test MOSFET. Thus, fewer processing steps minimize contamination of the test MOSFET. Minimized contamination is desired because failure of the test MOSFET from contamination obscures testing of the operation of the MOSFET with a new material for a structure of the test MOSFET. In addition, the width of the test MOSFET around the perimeter of the shaped area is relatively large to minimize current crowding effects and to minimize parasitic resistance of the test MOSFET. Current crowding effects and parasitic resistance of a MOSFET degrade the proper operation of the MOSFET to obscure testing of the operation of the test MOSFET with a new material for a structure of the test MOSFET.

The foregoing is by way of example only and is not intended to be limiting. For example, any specified material or any specified dimension of any structure described herein is by way of example only. In addition, as will be understood by those skilled in the art, the structures described herein may be made or used in the same way regardless of their position and orientation. Accordingly, it is to be understood that terms and phrases such as "over," "side," and "on" as used herein refer to relative location and orientation of various portions of the structures with respect to one another, and are not intended to suggest that any particular absolute orientation with respect to external objects is necessary or required.

Furthermore, the test MOSFET may be fabricated with a newly developed material for any structure of the test MOSFET such as for the gate dielectric 218 or the gate electrode 220 for example to test operation of the test MOSFET with such newly developed material. Also, the present invention may be practiced with other types of shapes for the dummy structure 209 aside from the example circular shape, such as a square shape for example, as would be apparent to one of ordinary skill in the art of integrated circuit fabrication from the description herein.

The present invention is limited only as defined in the following claims and equivalents thereof.

I claim:

1. A method for fabricating a test field effect transistor on a semiconductor substrate, the method including the steps of:

A. depositing a layer of gate dielectric material on said semiconductor substrate;

B. depositing a layer of gate electrode material on said layer of gate dielectric material;

C. forming a dummy structure on said gate electrode material, wherein said dummy structure is disposed over a shaped area of said gate electrode material and of said semiconductor substrate, and wherein said dummy structure has at least one sidewall around a perimeter of said shaped area;

D. forming a spacer structure to surround said at least one sidewall of said dummy structure outside of said perimeter of said shaped area;

wherein said spacer structure has a width extending out from said perimeter of said shaped area;

E. etching away said dummy structure such that said shaped area of said gate electrode material is exposed and such that said spacer structure remains outside of said perimeter of said shaped area;

F. etching away any exposed regions of said gate electrode material and of said gate dielectric material not under said spacer structure, wherein said gate dielectric material remaining under said spacer structure forms a gate dielectric of said test field effect transistor, and wherein said gate electrode material remaining under said spacer structure forms a gate electrode of said test field effect transistor, and wherein said gate dielectric and said gate electrode are formed outside of said perimeter of said shaped area on said semiconductor substrate; and G. implanting a drain and source dopant into exposed regions of said semiconductor substrate to form a first drain or source junction from said drain and source dopant being implanted into said semiconductor substrate within said shaped area surrounded by said gate dielectric and said gate electrode, and to form a second drain or source junction from said drain and source dopant being implanted into said semiconductor substrate outside said shaped area beyond said gate dielectric and said gate electrode;

and wherein a width of said test field effect transistor is said perimeter of said shaped area, and wherein a length of said test field effect transistor is the width of said gate dielectric and said gate electrode extending out from said perimeter of said shaped area.

2. The method of claim 1, further including the steps of:

forming a first drain or source contact on said first drain or source junction;

forming a gate contact on a portion of said gate electrode; and forming a second drain or source contact on a portion of said second drain or source junction.

3. The method of claim 1, wherein said semiconductor substrate is comprised of silicon, and wherein said dummy structure is comprised of a bottom buffer oxide ($SiO_2$) structure having a thickness in a range of from about 100 angstroms to about 200 angstroms and of a top nitride ($Si_3N_4$) structure having a thickness in a range of from about 1000 angstroms to about 2000 angstroms.

4. The method of claim 3, wherein said dummy structure has a circular shape with a diameter of about 0.5 micrometers.

5. The method of claim 3, wherein said spacer structure is comprised of silicon dioxide ($SiO_2$) having said width in a range of from about 20 nanometers to about 200 nanometers extending from said at least one sidewall of said dummy structure.

6. The method of claim 1, wherein said gate dielectric material has a dielectric constant that is higher than that of silicon dioxide ($SiO_2$), and wherein said gate electrode material is comprised of one polysilicon, polysilicon germanium, or a metal.

7. The method of claim 1, wherein said drain and source dopant is comprised of an N-type dopant for fabrication of an NMOSFET (N-channel Metal Oxide Semiconductor Field Effect Transistor) for said test field effect transistor.

8. The method of claim 1, wherein said drain and source dopant is comprised of a P-type dopant for fabrication of a PMOSFET (P-channel Metal Oxide Semiconductor Field Effect Transistor) for said test field effect transistor.

9. A method for fabricating a test MOSFET (metal oxide semiconductor field effect transistor) on a semiconductor substrate comprised of silicon, the method including the steps of:

A. depositing a layer of gate dielectric material on said semiconductor substrate;

wherein said gate dielectric material has a dielectric constant that is higher than that of silicon dioxide ($SiO_2$);

B. depositing a layer of gate electrode material on said layer of gate dielectric material;

wherein said gate electrode material is comprised of one polysilicon, polysilicon germanium, or a metal;

C. forming a dummy structure on said gate electrode material, wherein said dummy structure is disposed over a shaped area of said gate electrode material and of said semiconductor substrate, and wherein said dummy structure has at least one sidewall around a perimeter of said shaped area;

wherein said dummy structure is comprised of a bottom buffer oxide ($SiO_2$) structure having a thickness in a range of from about 100 angstroms to about 200 angstroms and of a top nitride ($Si_3N_4$) structure having a thickness in a range of from about 1000 angstroms to about 2000 angstroms;

and wherein said dummy structure has a circular shape with a diameter of about 0.5 micrometers;

D. forming a spacer structure to surround said at least one sidewall of said dummy structure outside of said perimeter of said shaped area;

wherein said spacer structure is comprised of silicon dioxide ($SiO_2$) having a width in a range of from about 20 nanometers to about 200 nanometers extending from said at least one sidewall of said dummy structure;

E. etching away said dummy structure such that said shaped area of said gate electrode material is exposed and such that said spacer structure remains outside of said perimeter of said shaped area;

F. etching away any exposed regions of said gate electrode material and of said gate dielectric material not under said spacer structure, wherein said gate dielectric material remaining under said spacer structure forms a gate dielectric of said test MOSFET, and wherein said gate electrode material remaining under said spacer structure forms a gate electrode of said test MOSFET, and wherein said gate dielectric and said gate electrode are formed outside of said perimeter of said shaped area on said semiconductor substrate;

G. implanting a drain and source dopant into exposed regions of said semiconductor substrate to form a first drain or source junction from said drain and source dopant being implanted into said semiconductor substrate within said shaped area surrounded by said gate dielectric and said gate electrode, and to form a second drain or source junction from said drain and source dopant being implanted into said semiconductor substrate outside said shaped area beyond said gate dielectric and said gate electrode;

wherein said drain and source dopant is comprised of an N-type dopant for fabrication of an NMOSFET (N-channel Metal Oxide Semiconductor Field Effect Transistor);

and wherein said drain and source dopant is comprised of a P-type dopant for fabrication of a PMOSFET (P-channel Metal Oxide Semiconductor Field Effect Transistor);

and wherein a width of said test field effect transistor is said perimeter of said shaped area, and wherein a length of said test field effect transistor is the width of said gate dielectric and said gate electrode extending out from said perimeter of said shaped area;

H. forming a first drain or source contact on said first drain or source junction;
I. forming a gate contact on a portion of said gate electrode; and
J. forming a second drain or source contact on a portion of said second drain or source junction.

* * * * *